United States Patent
Pan et al.

(10) Patent No.: US 7,030,023 B2
(45) Date of Patent: Apr. 18, 2006

(54) METHOD FOR SIMULTANEOUS DEGAS AND BAKING IN COPPER DAMASCENE PROCESS

(75) Inventors: Shing-Chyang Pan, Hsinchu (TW); Ching-Hua Hsieh, Hsinchu (TW); Jing-Cheng Lin, Hsinchu (TW); Hsien-Ming Lee, Changhua (TW); Cheng-Lin Huang, Taipei (TW); Shau-Lin Shue, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 178 days.

(21) Appl. No.: 10/655,972

(22) Filed: Sep. 4, 2003

(65) Prior Publication Data
US 2005/0054202 A1 Mar. 10, 2005

(51) Int. Cl.
*H01L 21/302* (2006.01)
(52) U.S. Cl. .................. 438/700; 438/710; 438/712; 438/715
(58) Field of Classification Search ............... 438/692, 438/700, 710, 712, 715
See application file for complete search history.

(56) References Cited

U.S. PATENT DOCUMENTS

| 6,554,914 | B1 * | 4/2003 | Rozbicki et al. | 148/238 |
| 6,767,788 | B1 * | 7/2004 | Kim | 438/253 |
| 2004/0023485 | A1 * | 2/2004 | Pan et al. | 438/637 |
| 2004/0127002 | A1 * | 7/2004 | Kim | 438/586 |

* cited by examiner

*Primary Examiner*—Nadine G. Norton
*Assistant Examiner*—Binh X. Tran
(74) *Attorney, Agent, or Firm*—Tung & Assoc

(57) ABSTRACT

A method for forming a copper damascene feature including providing a semiconductor process wafer including at least one via opening formed to extend through a thickness of at least one dielectric insulating layer and an overlying trench line opening encompassing the at least one via opening to form a dual damascene opening; etching through an etch stop layer at the at least one via opening bottom portion to expose an underlying copper area; carrying out a sub-atmospheric DEGAS process with simultaneous heating of the process wafer in a hydrogen containing ambient; carrying out an in-situ sputter-clean process; and, forming a barrier layer in-situ to line the dual damascene opening.

20 Claims, 2 Drawing Sheets

METHOD FOR SIMULTANEOUS DEGAS AND BAKING IN COPPER DAMASCENE PROCESS

FIELD OF THE INVENTION

This invention generally relates to semiconductor processing methods for forming metal contacts in a multi-level semiconductor device and more particularly a method for forming copper damascene features with reduced number of processing steps.

BACKGROUND OF THE INVENTION

Formation of multi-level semiconductor devices entails the formation of multiple levels of metal interconnects such as vias and trench lines (local interconnect lines). For example, in a multi-level semiconductor device there are frequently formed several layers of vias interconnecting wider metal interconnect line portions among the multiple layers or levels of the device. Frequently, several vias will connect a wider metal portion, for example a bonding pad in an uppermost metallization layer to an underlying metallization level through several relatively narrower vias. For example the vias and metal interconnect lines are typically formed with line widths having a dimensions of about 0.25 microns and smaller. The electrical continuity of the various metal interconnects, particularly through the vias is critical to proper functionality of a device.

Copper and copper alloys are increasingly becoming the metal of choice in forming damascene structures as it has improved electrical resistivity and electrical migration resistance compared to aluminum, previously widely used as a metallization metal. The use of copper, however, has presented several technical manufacturing problems that must be overcome for successful implementation of the technology. For example, copper cannot be successfully etched to form metal lines since it does not form volatile components with known etching chemistry's. As a result, copper lines must be formed as metal inlaid structures, also referred to a damascenes or dual damascenes where an anisotropically etched opening is formed in a dielectric insulating layer followed by filling the opening with copper and planarizing the wafer process surface by a chemical mechanical polishing step.

One difficulty with prior art copper damascene processes is the process involving etching through an etch stop layer at a via bottom portion to form closed communication with an underlying copper region and the subsequent process of barrier layer deposition followed by copper seed layer deposition which takes place prior to filling the copper damascene, for example dual damascene, with copper according to an electro-chemical plating process. In prior art processes, a furnace baking method has been used to bake the dual damascene opening following etching through the etch stop layer to remove moisture from the IMD layer, particularly porous IMD layers and to prevent the formation of copper oxides over the underlying copper region. In addition, removing residual etching chemistries are removed to avoid corrosive attack of the copper prior to formation of a barrier layer to line the dual damascene opening.

The prior art process of a separate furnace baking method presents a significant slowdown in wafer throughput, typically requiring several hours, and frequently requiring costly ambient environmental controls in wafer queing stations to prevent the further absorption of moisture by IMD layers, formation of copper oxides, and corrosive attack of exposed copper portions.

There is therefore a need in the semiconductor art for an improved method to form copper damascene features to avoid or prevent moisture absorption, formation of copper oxides, and corrosive chemical attack of exposed copper portions while reducing a cycle time and processing cost.

It is therefore an object of the invention to provide an improved method to form copper damascene features to avoid or prevent moisture absorption, formation of copper oxides, and corrosive chemical attack of exposed copper portions while reducing a cycle time and processing cost in addition to overcoming other deficiencies and shortcomings of the prior art.

SUMMARY OF THE INVENTION

To achieve the foregoing and other objects, and in accordance with the purposes of the present invention, as embodied and broadly described herein, the present invention provides a method for forming a copper damascene feature.

In a first embodiment the method includes providing a semiconductor process wafer including at least one via opening formed to extend through a thickness of at least one dielectric insulating layer and an overlying trench line opening encompassing the at least one via opening to form a dual damascene opening; etching through an etch stop layer at the at least one via opening bottom portion to expose an underlying copper area; carrying out a sub-atmospheric DEGAS process with simultaneous heating of the process wafer in a hydrogen containing ambient; carrying out an in-situ sputter-clean process; and, forming a barrier layer in-situ to line the dual damascene opening.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to and is particularly advantageously implemented on forming of copper dual damascenes it will be appreciated that the method of the present invention is equally applicable to the formation of single copper damascenes and relatively thick and wide copper damascene structures including, for example, bonding pads or wide trench lines.

In an exemplary embodiment of the present invention, reference is made to FIGS. 1A–1D where cross sectional side views of a portion of a multi-level semiconductor device is shown at stages of manufacture according to an exemplary dual damascene process according to an embodiment the invention.

Figure 1A:
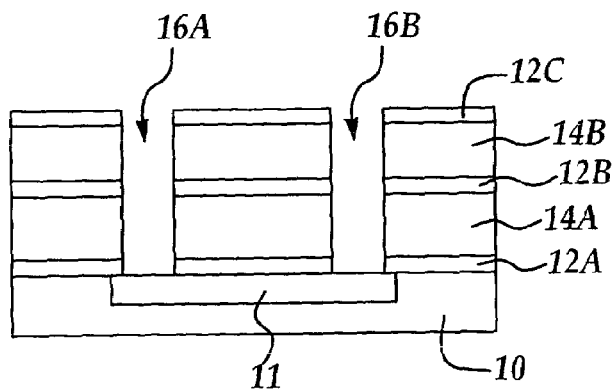
FIGS. 1A–1D are cross sectional side views of a portion of a multi-level semiconductor device showing manufacturing stages according to an embodiment of the present invention.

Shown in FIG. 1A is a lowermost first etch stop layer 12A, formed over a copper region 11, formed in dielectric insulating layer 10. The first etch stop layer 12A, preferably formed of silicon nitride or silicon carbide, for example, by an LPCVD or PECVD process, is formed to a thickness of about 300 to about 1000 Angstroms. Formed overlying the first etch stop layer 12A is first dielectric insulating layer 14A, also referred to as an inter-metal dielectric (IMD) layer. The IMD layer 12A is preferably formed of a low-K (low dielectric constant) e.g., less than about 2.8, more preferably less than about 2.5, silicon oxide based material, including an interconnecting porous structure, for example, carbon doped silicon oxide or organo-silane glass, formed by a PECVD or HDP-CVD process to a thickness of about 3000 to about 8000 Angstroms. Formed over the first dielectric insulating layer 14A, is formed a second etch stop layer 12B, preferably formed of silicon nitride or silicon carbide, formed at a thickness of about 300 Angstroms to about 1000 Angstroms.

Formed over the second etch stop layer 12B is a second IMD layer 14B, formed in a similar manner using preferred materials as for the first IMD layer 14A. The second IMD layer 14B may be formed within the same range of thicknesses as the first IMD layer, for example having about the same or less thickness as the first IMD layer 14A. It will be appreciated the dual damascene opening as explained below may be formed in a single IMD layer e.g., IMD layer 14A including an underlying etch stop layer e.g., 12A. Formed over the second TMD layer e.g., 14B (e.g., uppermost layer in a metallization layer) is formed a bottom anti-reflectance coating (BARC) of silicon oxynitride e.g., 12C, formed at a thickness of quarter wavelength increments in a PECVD or HDP-CVD process to reduce light reflectance from a subsequent photolithographic patterning step and which additionally acts as a hard mask layer in subsequent dual damascene opening reactive ion etch (RIE) process.

Still referring to FIG. 1A, via openings e.g., 16A, 16B, for example having a line width of about 0.25 microns or less are formed by a conventional photolithographic patterning and reactive ion etch (RIE) process where a thickness portion of IMD layers 14B and 14A are etched through, preferably exposing the first etch stop layer 12A to form via openings.

Figure 1B:
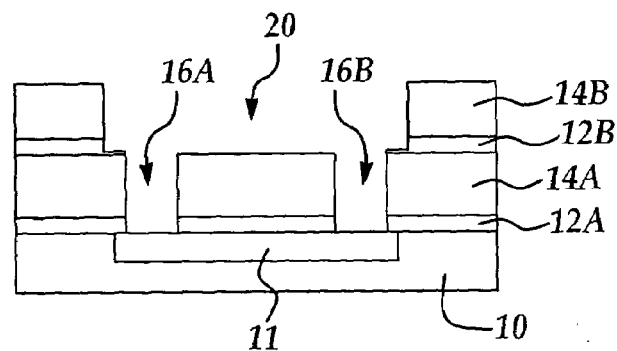

Referring to FIG. 1B, a second conventional photolithographic patterning process is carried out followed by a conventional RIE process to etch a through a thickness portion of IMD layer 14B to form a trench line opening e.g., 20 overlying and encompassing one or more via openings e.g., 16A, 16B. Following formation of the trench opening 20, a patterned photoresist layer (not shown) is stripped by a conventional process, e.g., at least one of ashing and wet stripping and the dual damascene opening e.g., trench opening 20 and via openings 16A and 16B are subjected to a second conventional RIE etching process to etch through a thickness of etch stop layer 12A to expose underlying copper filled region, 11 to include etching through a thickness portion of the overlying hardmask layer 12C and the second etch stop layer 12B.

In an aspect of the present invention, following formation the dual damascene opening e.g., trench opening 20 and via openings 16A and 16B, the semiconductor process wafer is transferred to a single wafer DEGAS chamber, preferably in-situ, where at least a pressure, ambient gaseous atmosphere and wafer temperature may be controlled. For example a cluster tool having a controlled sub-atmospheric ambient with reduced oxygen levels, as is known in the art may be used to transfer the wafer from an etching chamber to the DEGAS chamber in-situ to prevent exposure to moisture and oxygen. For example, the DEGAS chamber preferably includes means for heating the wafer, for example a conventional wafer chuck including resistively heated elements and/or high intensity lamps directed at the wafer surface for heating the process wafer surface. In addition, the DEGAS chamber may be a conventional physical vapor deposition (PVD) chamber, for example an RF sputtering, magnetron sputtering, ionized metal plasma (IMP), self-ionized plasma (SIP) sputtering chamber for carrying out a subsequent sputter-clean and/or PVD process for depositing a barrier layer to line the dual damascene opening, or be a separate dedicated process chamber in a cluster tool including multiple chambers for the respective DEGAS, sputter-clean and subsequent PVD and/or CVD processes.

According to an aspect of the invention, both a process wafer degassing process and a baking process are carried out in the DEGAS chamber prior to an in-situ sputter-clean process which is then followed by an in-situ barrier layer PVD and/or CVD deposition process. Preferably, the DEGAS process is carried out simultaneously at least during a portion of the baking (heating) process. For example the DEGAS/baking process is preferably carried out simultaneously at sub-atmospheric pressures in a hydrogen containing ambient, preferably a mixture of $H_2$ gas and an inert gas such as He, $N_2$, and Ar. According to an aspect of the invention, preferably, the process wafer is simultaneously heated to a temperature between about 100° C. and about 500° C., more preferably between about 250° C. and about 450° C. in the DEGAS chamber for a period of about 20 seconds to about 120 seconds in the presence of a mixture of $H_2$/inert gas while maintaining a pressure of between about 1 mTorr and about 10 Torr, more preferably between about 10 mTorr and about 1 Torr, most preferably between about 10 mTorr and about 100 mTorr.

It has been found that the baking process to remove moisture from low-K porous IMD layers and the DEGAS process can advantageously be accomplished simultaneously in the presence of a hydrogen containing atmosphere. For example, porous low-K inorganic IMD layers typically strongly absorb moisture prior to and during the etching process, heretofore making a furnace baking process necessary to adequately remove moisture to provide for effective deposition and adhesion of a subsequently deposited barrier layer. According to an aspect of the present invention, it has been found that in the presence of an $H_2$ containing ambient at sub-atmospheric pressures and temperatures of about 100° C., moisture as well as adsorbed gases present from a previous etching process, for example oxygen, nitrogen, and fluorine, are effectively removed at the preferred sub-atmospheric DEGAS pressures and baking temperatures at relatively short times thereby avoiding the necessity of a separate furnace baking process, for example at atmospheric pressures, which may take several hours according to prior art processes. In addition, the $H_2$ containing ambient effectively reduces exposed copper surfaces to remove copper oxides. Preferably, the amount of $H_2$ gas present in the sub-atmospheric ambient during the DEGAS/baking process is from about 1% to about 20%, more preferably from about 3% to about 10% with the remaining portion (volume) made up of an inert gas.

Following the DEGAS/baking process, the process wafer is subjected to an in-situ sputter-clean process using a plasma formed of inert gas, more preferably, a mixture of hydrogen and inert gas, to prepare the surface for either PVD or CVD deposition of one or more barrier layers. The sputter-clean process further reduces any remaining copper oxides thereby improving an electrical contact resistance of subsequently deposited barrier layers and copper.

Figure 1C:
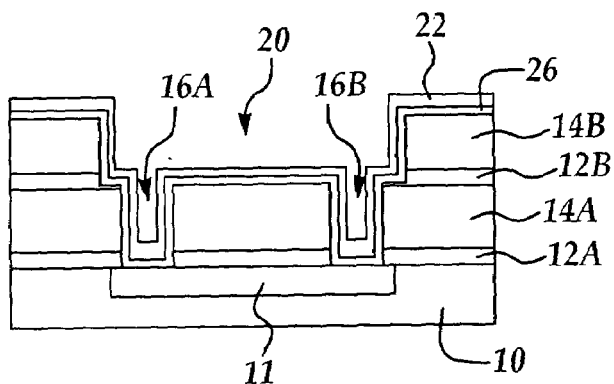

Referring to FIG. 1C, one or more barrier layers e.g., 22 formed of one of a refractory metal, refractory metal nitride, and silicided refractory metal nitride are deposited by conventional processes. For example a Ti/TiN, Ta/TaN, TiSiN, or TaSiN barrier layer or barrier layer stack is deposited by a PVD and/or CVD process to a thickness of about 100 to about 400 Angstroms. For example a refractory metal such as Ta and Ti may be deposited by PVD followed by CVD deposition of a respective refractory metal nitride such as TaN or TiN. For example, the uppermost barrier layer is a tantalum nitride (TaN) layer formed by an MOCVD (metal-organic CVD) process using tantalum metal organic precursors, for example Ethyltrikas Diethylamido Tantalum (ET-DET) or TBTDET and ammonia ($NH_3$). The MOCVD process is preferably formed at a temperature of about 250° C. to about 450° C. at a pressure of about 1 mTorr to about 100 mTorr and is optionally followed by a plasma treatment with an inert gas to densify the barrier layer. The barrier layer 22 is preferably deposited to a thickness of about 100 Angstroms to about 400 Angstroms.

Still referring to FIG. 1C, following deposition of the barrier layer 22, a seed layer 26 of copper is deposited by PVD and/or CVD method to a thickness of about 50 Angstroms to about 500 Angstroms. The deposition of a thicker seed layer at a bottom portion of the via openings advantageously aids a subsequent electrochemical deposition (ECD) process such that the via openings may be filled without creating voids. Preferably, a PVD process, for example using a collimated source is used to deposit the copper seed layer 26. Typically the step coverage on the sidewalls is preferably from 10% to about 20% of bottom portion coverage; therefore preferential bottom coverage of the vias will prevent forming closed off voids in a subsequent ECD process which tends to plate faster in an upper portion of the opening due to a higher current density.

Figure 1D:
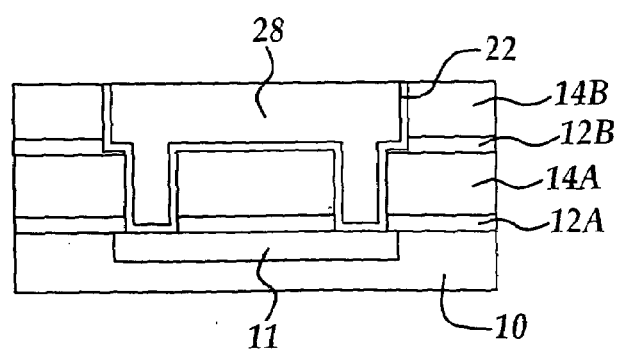

Referring to FIG. 1D, following deposition of the copper seed layer the dual damascene is completed by a conventional ECD process to fill the dual damascene opening with copper layer 28 (copper seed layer not shown). The process wafer is then subjected to a conventional multi-step CMP process to remove the excess copper layer 28 and at least the barrier layer 22 above the trench level followed by an oxide buffing process.

Thus a method has been presented for carrying out a DEGAS/baking process for a copper damascene opening formed in a low-K inorganic porous IMD layer in a single sub-atmospheric process in a hydrogen containing ambient thereby avoiding the necessity of a separate furnace baking process prior to the DEGAS process to remove both residual moisture and adsorbed etching gases. In addition, the simultaneous DEGAS/baking process in a hydrogen containing ambient effectively reduces copper oxides in underlying exposed copper portions thereby lowering an electrical contact resistance for the subsequently filled copper damascene. As a result a process cycle time is substantially reduced by several hours and the electrical properties of copper damascenes are improved, particularly for copper damascene linewidths below about 0.25 microns, including below about 0.1 micron.

Figure 2:
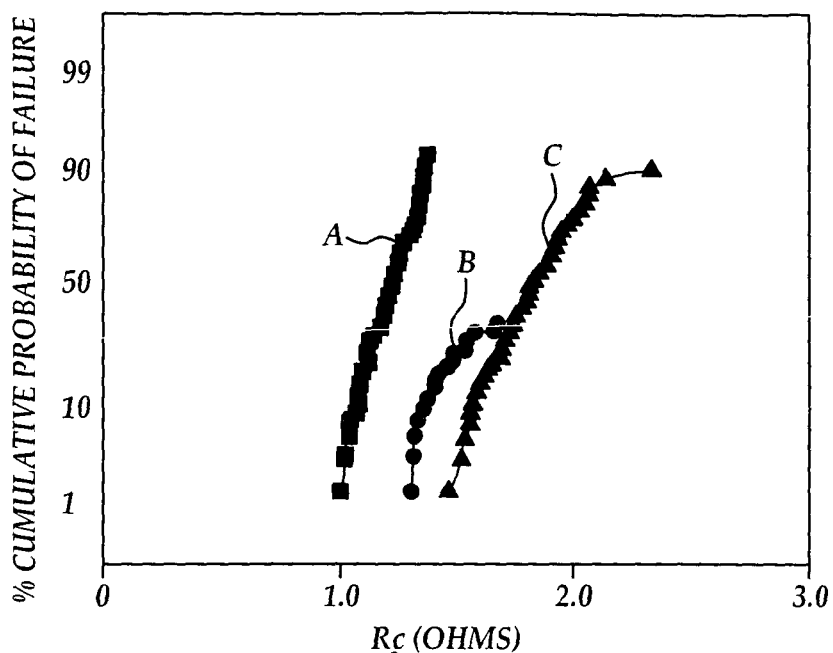
FIG. 2 is representative electrical reliability data comprising results according to copper damascenes formed according to preferred embodiments compared to prior art processes.

For example, referring to FIG. 2 is shown a cumulative failure probability plot, also referred to as a Weibull distribution plot. Shown on the vertical axis is the cumulative probability of failure of copper dual damascenes. On the horizontal axis is shown electrical contact resistance (Rc) in Ohms. Line C represents results for copper dual damascene structures formed according to a prior art furnace baking process followed by a DEGAS process. Line B, represents control results with only a prior art DEGAS process carried out. Line C represents a DEGASS/baking process carried out according to preferred embodiments. It is seen that the method of the present invention (line A) for forming copper damascene structures with a simultaneous DEGAS/baking process exhibits significantly improved electrical properties and reliability compared to prior art processes e.g., furnace bake followed by DEGAS process (line C) and the control results (line B) representing only a DEGAS process.

Figure 3:
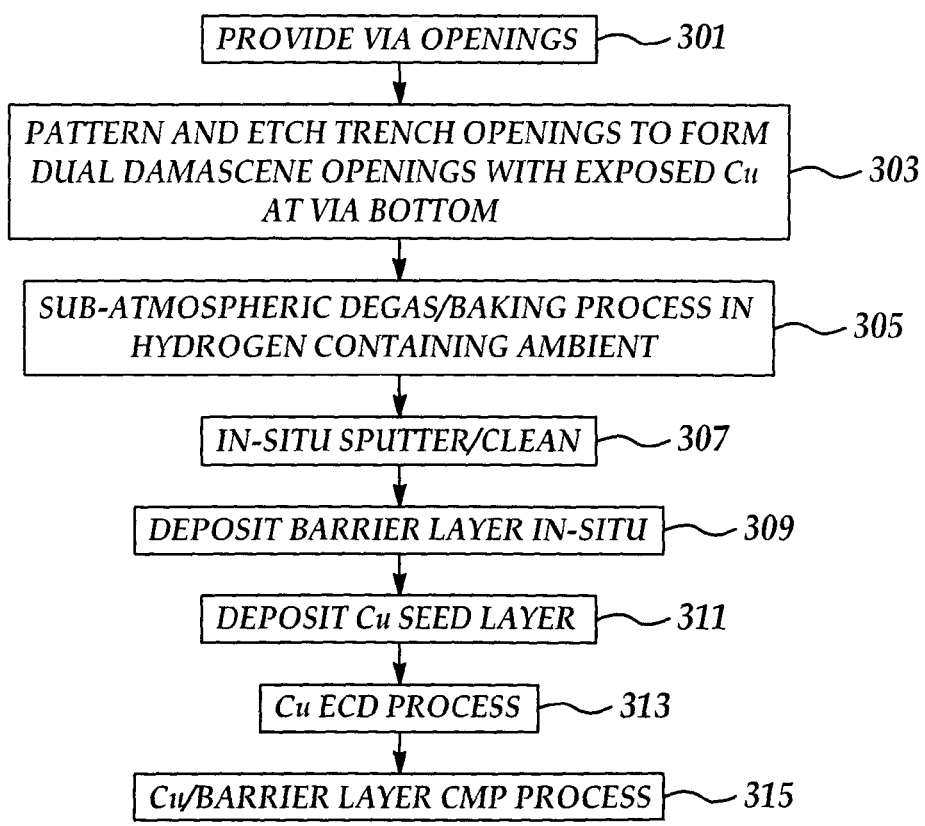
FIG. 3 is a process flow diagram including several embodiments of the present invention.

In FIG. 3 is shown a process flow diagram including several embodiments of the present invention. In process 301 a process wafer comprising via openings extending through at least one IMD layer is provided. In process 303 trench openings are photolithographically patterned and anisotropically etched to encompass one or more via openings to form a dual damascene opening exposing Cu at via bottoms. In process 305, a sub-atmospheric DEGAS/baking process in a hydrogen containing atmosphere, preferably in-situ, is carried out in a single process prior to an in-situ sputter/clean process in process 307. In process 309 a barrier layer is deposited, preferably in-situ. In process 311 a copper seed layer is deposited over the barrier layer. In process 313, a copper ECD process is carried out to fill the dual damascene opening. In process 313, a CMP process is carried out to remove layers overlying the trench level.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a copper damascene feature with improved electrical properties including reducing moisture and etching residues from a damascene opening comprising the steps of:

providing a semiconductor process wafer comprising at least one via damascene opening formed to extend through a thickness of at least one dielectric layer, said opening comprising one of a single damascene opening and a dual damascene opening;

etching through an etch stop layer at the at least one damascene opening bottom portion to expose an underlying copper area;

then carrying out a sub-atmospheric DEGAS process in-situ with simultaneous heating of the process wafer in a hydrogen containing ambient;

then carrying out an in-situ sputter-clean process; and, then forming a barrier layer in-situ to line the damascene opening.

2. The method of claim 1, further comprising the steps of:

forming a copper seed layer in-situ to line the dual damascene opening;

carrying out an electrochemical copper deposition process to fill the dual damascene opening with a copper layer; and, carrying out a CMP process to remove the copper layer and the barrier layer above the opening level.

3. The method of claim 1, wherein the sub-atmospheric DEGAS process is carried out at a temperature between about 100° C. and about 500° C.

4. The method of claim 1, wherein the sub-atmospheric DEGAS process is carried out at a temperature between about 250° C. and about 450° C.

5. The method of claim 1, wherein the sub-atmospheric DEGAS process is carried out for a period of between about 20 seconds and about 120 seconds.

6. The method of claim 1, wherein the sputter-clean process comprises hydrogen gas.

7. The method of claim 1, wherein the in-situ steps comprising the sub-atmospheric DEGAS process, the sputter-clean process, and the barrier layer formation process comprise transferring the semiconductor process wafer between said processes in a controlled sub-atmospheric ambient with reduced oxygen levels.

8. The method of claim 1, wherein the hydrogen containing ambient consists essentially of hydrogen and at least one inert gas, said ambient provided at a pressure of about 1 mTorr to about 10 Torr.

9. The method of claim 8, wherein the hydrogen containing ambient is provided at a pressure of about 1 mTorr to about 100 mTorr.

10. The method of claim 1, wherein the barrier layer comprises at least one layer selected from the group consisting of refractory metals, refractory metal nitrides, and silicided refractory metal nitrides.

11. The method of claim 10, wherein the barrier layer comprises at least one layer selected from the group consisting of Ta, Ti, TaN, TiN, TaSiN, and TiSiN.

12. A method for forming copper damascene features in low-K porous dielectric layers with improved electrical properties including reducing moisture and etching residues from a damascene opening comprising the steps of:
  providing a semiconductor process wafer comprising at least one damascene opening formed to extend through a thickness of at least one inorganic low-K dielectric layer, said opening comprising one of a single damascene opening and a dual damascene opening;
  etching through an etch stop layer at the damascene opening bottom portion to expose an underlying copper area;
  then carrying out in-situ a sub-atmospheric DEGAS process with simultaneous heating of the process wafer in a hydrogen containing ambient;
  then carrying out an in-situ sputter-clean process comprising hydrogen gas; and,
  then forming a barrier layer in-situ to line the damascene opening.

13. The method of claim 12, further comprising the steps of:
  forming a copper seed layer in-situ to line the damascene opening;
  carrying out an electrochemical copper deposition process to fill the damascene opening with a copper layer; and,
  carrying out a CMP process to remove the copper layer and the barrier layer above the opening level.

14. The method of claim 12, wherein the sub-atmospheric DEGAS process is carried out at a temperature between about 100° C. and about 500° C.

15. The method of claim 12, wherein the a sub-atmospheric DEGAS process is carried out at a temperature between about 250° C. and about 450° C.

16. The method of claim 12, wherein the sub-atmospheric DEGAS process is carried out for a period of between about 20 seconds and about 120 seconds.

17. The method of claim 12, wherein the barrier layer comprises at least one layer selected from the group consisting of Ta, Ti, TaN, TiN, TaSiN, and TiSiN.

18. The method of claim 12, wherein the in-situ steps comprising the sub-atmospheric DEGAS process, the sputter-clean process, and the barrier layer formation process comprise transferring the semiconductor process wafer between said processes in a controlled sub-atmospheric ambient with reduced oxygen levels.

19. The method of claim 12, wherein the hydrogen containing ambient consists of hydrogen and at least one inert gas, said ambient provided at a pressure of about 1 mTorr to about 10 Torr.

20. The method of claim 19, wherein the hydrogen containing ambient is provided at a pressure of about 1 mTorr to about 100 mTorr.

* * * * *